United States Patent
Wei

(10) Patent No.: US 6,210,068 B1
(45) Date of Patent: Apr. 3, 2001

(54) COMPUTER CENTRAL PROCESSING UNIT HEAT DISSIPATION DEVICE LATCHING STRUCTURE

(76) Inventor: Wen-Chen Wei, P.O. Box No. 6-57, Chung-Ho City, Taipei Hsien 235 (TW)

( * ) Notice: Subject to any disclaimer, the term of this patent is extended or adjusted under 35 U.S.C. 154(b) by 0 days.

(21) Appl. No.: 09/472,212

(22) Filed: Dec. 27, 1999

(51) Int. Cl.[7] .................................................. H05K 7/20
(52) U.S. Cl. ..................... 403/353; 403/329; 403/322.4; 403/303; 361/704
(58) Field of Search .................................. 403/303, 329, 403/353, 387, 388, 389, 395, 397, 322.4; 361/704, 687, 686, 608, 801, 802, 759, 726, 727, 732, 740, 747, 377

(56) References Cited

U.S. PATENT DOCUMENTS

| | | | |
|---|---|---|---|
| 481,637 | * | 8/1892 | Poole ...................................... 403/387 |
| 4,648,737 | * | 3/1987 | Lake, Jr. et al. .................. 403/322.4 |
| 5,232,303 | * | 8/1993 | Rubner .......................... 403/322.4 X |
| 5,662,163 | * | 9/1997 | Mira .................................. 361/704 X |
| 5,959,838 | * | 9/1999 | Liang ................................ 361/704 X |
| 5,973,921 | * | 10/1999 | Lin .................................... 361/704 X |
| 5,982,622 | * | 11/1999 | Chiou ................................... 361/704 |
| 6,008,990 | * | 12/1999 | Liu ....................................... 361/704 |
| 6,055,159 | * | 4/2000 | Sun ...................................... 361/704 |
| 6,097,601 | * | 8/2000 | Lee ....................................... 361/704 |
| 6,104,609 | * | 8/2000 | Chen ................................ 361/704 X |

* cited by examiner

Primary Examiner—Lynne H. Browne
Assistant Examiner—David E. Bochna

(57) ABSTRACT

A computer central processing unit (CPU) heat dissipation device latching structure utilized to attach a heat dissipation device to a computer CPU. The latching structure consists of tensile latch element unitarily fabricated such that the rectangular tensile latch element is curved in shape and has a number of fastening holes formed. The directional orientation and angular disposition of the fastening holes differ to allow for rotational alignment with the mounting holes of the CPU board, while also providing for alignment with and coupling to its mounting pins. A press section is disposed on one side to enable the easy rotation of the tensile latch element such that structure of the present invention is capable of simply and rapidly achieving a tight union between the heat dissipation device and the computer CPU.

2 Claims, 6 Drawing Sheets

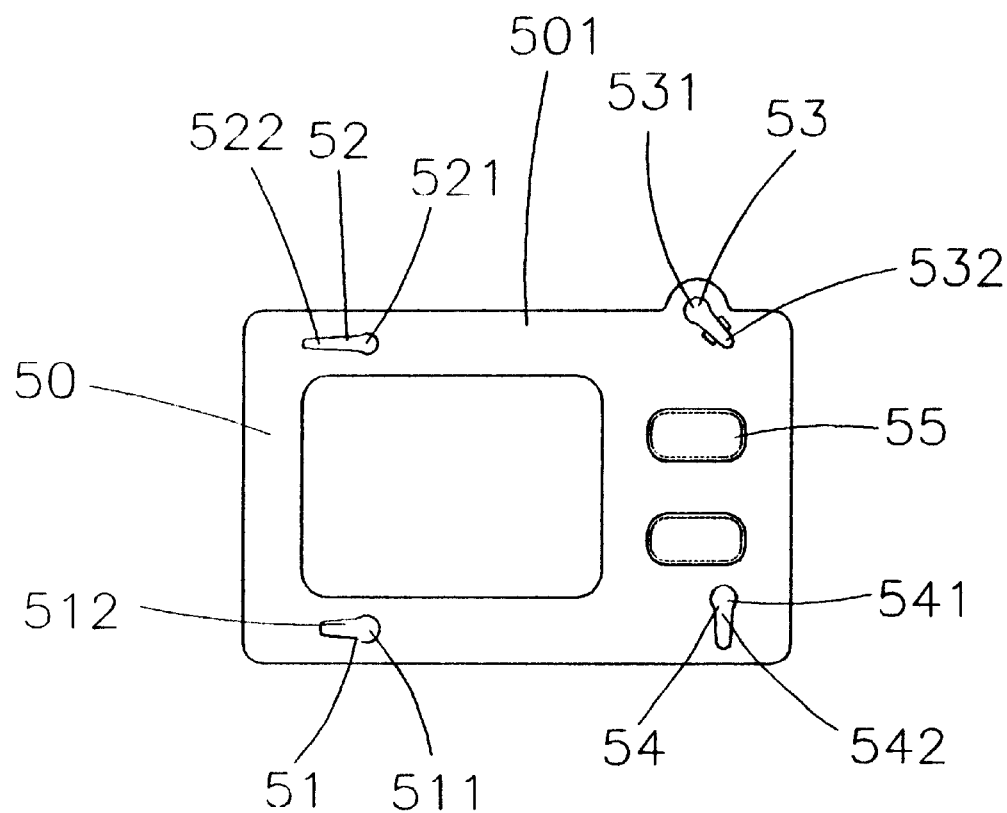
Fig. 4
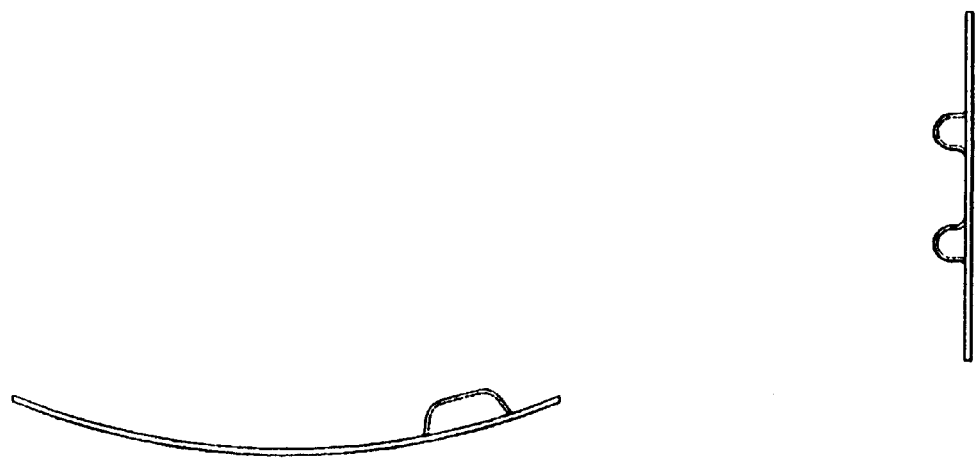
Fig. 6
Fig. 5

COMPUTER CENTRAL PROCESSING UNIT HEAT DISSIPATION DEVICE LATCHING STRUCTURE

BACKGROUND OF THE INVENTION

1) Field of the Invention

The invention herein relates to a computer central processing unit (CPU) heat dissipation device latching structure comprised of a curved tensile latch element having a number of fastening holes of differing directional orientation and angular disposition to accommodate alignment with and coupling to the mounting pins of the present invention for the easy and rapid assembly of the heat dissipation device to the CPU.

2) Description of the Prior Art

Due to the continuous development of computer technology as well as integrated circuit production technology, central processing unit (CPU) execution and efficiency rates are becoming faster. As CPU execution speed increases, greater amounts of heat are produced and if CPU heat is not dissipated rapidly, computer operating stability will be adversely affected. To solve CPU overheating problems, the most direct and simplest approach is to additionally install a heat dissipation device on the CPU so that the high temperature currents produced by the CPU are diffused by the heat dissipation device to maintain CPU operating stability. Among the commonly available products at present, the conventional heat dissipation device shown in FIG. 1 and FIG. 2 is comprised of a fan and heat sink assembly, wherein the fan 11 is screw fastened to the top cover 12 of the heat sink 10, the mounting pins 15 of the heat sink 10 are inserted through the mounting holes 21 of the CPU board 20, and a spring clip 30 is then secured to the mounting pins 15, thereby holding the bottom plate 14 of the heat sink 10 tightly against the CPU 22 such that when the CPU 22 is operating, the high temperatures currents generated are diffused due to the air flow induced by the fan 11 through the fin area 13 of the heat sink 11. However, since the structure of the spring clip 30, as indicated in FIG. 1, is tile-like and consists of positioning grooves 31 indented laterally along each of the two sides, the outer edges of which are insertion fastened against the mounting pins 15, quality is difficult to control; for example, the unit may dislodge if not tightly fastening or squeezed due to forceful impact. Another variety presently available in the market, as indicated in FIG. 3, is a pull-type tensile fastening element 40 which is inconvenient due to the application of force involved during installation in that the thumb and index finger must grasp and pull the handle 41 and injury results if sufficient caution is not exercised and, furthermore, its excessively large physical dimensions not only wastes material and space, but also crowds other computer components.

In view of the various drawbacks in the design of the said conventional heat dissipation attachment structures that lead to numerous disadvantages in terms of practicality and installation, the inventor of the invention herein, based on long experience in electronic hardware production and technology, conducted research to find solutions to the said drawbacks which, following continuous research and refinements, culminated in the successful development of the computer central processing unit (CPU) heat dissipation device latching structure of the invention herein that is capable of eliminating the many shortcomings of the prior art technology.

The computer central processing unit (CPU) heat dissipation device latching structure of the invention herein is comprised of a curved rectangular tensile latch element of a one-piece punch fabricated design having four fastening holes formed in the tensile latch element for alignment with and coupling to the mounting pins; situated proximal to the four corners of a frame plate, each fastening hole consists of a slide positioning slot and a locating opening such that its profile is narrower at one end and gradually widens to terminate as a larger circular opening, of which the fastening hole (the first fastening hole) at the lower left corner of the frame plate faces the right by design and serves as a fastening hole center point, i.e., the locating opening faces the right; the fastening hole (the second fastening hole) at the upper left corner faces the right, however, its slide positioning slot is lengthier than that of the first fastening hole to enable the rotation of the tensile latch element; the fastening hole (the third fastening hole) at the upper right corner is situated in a section protruding upward from the frame plate and, furthermore, faces the left at an angle of approximately 45 degrees, thereby allowing for the alignment of the tensile latch element by rotation in coordination with the fastening hole (the fourth fastening hole) at the lower left corner and having a locating opening facing upward by design, which thereby enables the tensile latch element to be rapidly coupled tightly to the mounting pins by rotation alone without requiring forceful pushing, pulling, or squeezing. During installation, it is only necessary to insert the mounting pins into the first fastening hole and the second fastening hole, then, taking the first fastening hole as a center point, the tensile latch element is rotated to the right until it is postured at an angle, at which time the locating openings of the third fastening hole and the fourth fastening hole are aligned with the mounting pins and, after the tensile latch element is pushed downward, the mounting pins are inserted into the locating openings of the third fastening hole and fourth fastening hole, and then it is rotated to the left until secured into position, which completes the assembly of the heat dissipation device to the computer CPU. Furthermore, a projecting wave-shaped press section is situated in between the third fastening hole and the fourth fastening hole of the invention herein to increase frictional grip and facilitate rotation such that when the installer aligns and rotates the tensile latch element during installation, the tensile latch element is easily and stably turned around, with no injury to the installer.

SUMMARY OF THE INVENTION

Therefore, the primary objective of the invention herein is to provide a computer central processing unit (CPU) heat dissipation device latching structure comprised of a one-piece punch fabricated curved rectangular tensile latch element that secures a heat dissipation device to the CPU; formed in the said tensile latch element are fastening holes that match the positions of the mounting holes in the CPU board, while also being capable of being coupled to the aligned mounting pins by utilizing the differing directional orientations and angular dispositions of the four locating openings of the fastening holes for rotation and alignment to easily and rapidly install the heat dissipation device tightly against the computer CPU.

Another objective of the invention herein is to provide a computer central processing unit (CPU) heat dissipation device latching structure having a press section situated in between the third fastening hole and the fourth fastening hole to enable the easy and stable rotation of the tensile latch element and thereby prevent injury.

In achieving the said objectives of the invention herein, the technological means and overall structural innovations are disclosed to demonstrate the most feasible embodiments and, furthermore, the brief description of the drawings below and the following detailed description of the invention will enable a further understanding of the present invention.

BRIEF DESCRIPTION OF THE DRAWINGS

FIG. 4 is an orthographic drawing of the invention herein, as viewed from a top perspective.

FIG. 5 is an orthographic drawing of the invention herein, as viewed from a lateral perspective.

FIG. 6 is an orthographic drawing of the invention herein, as shown in an auxiliary view.

DETAILED DESCRIPTION OF THE INVENTION

Figure 1:
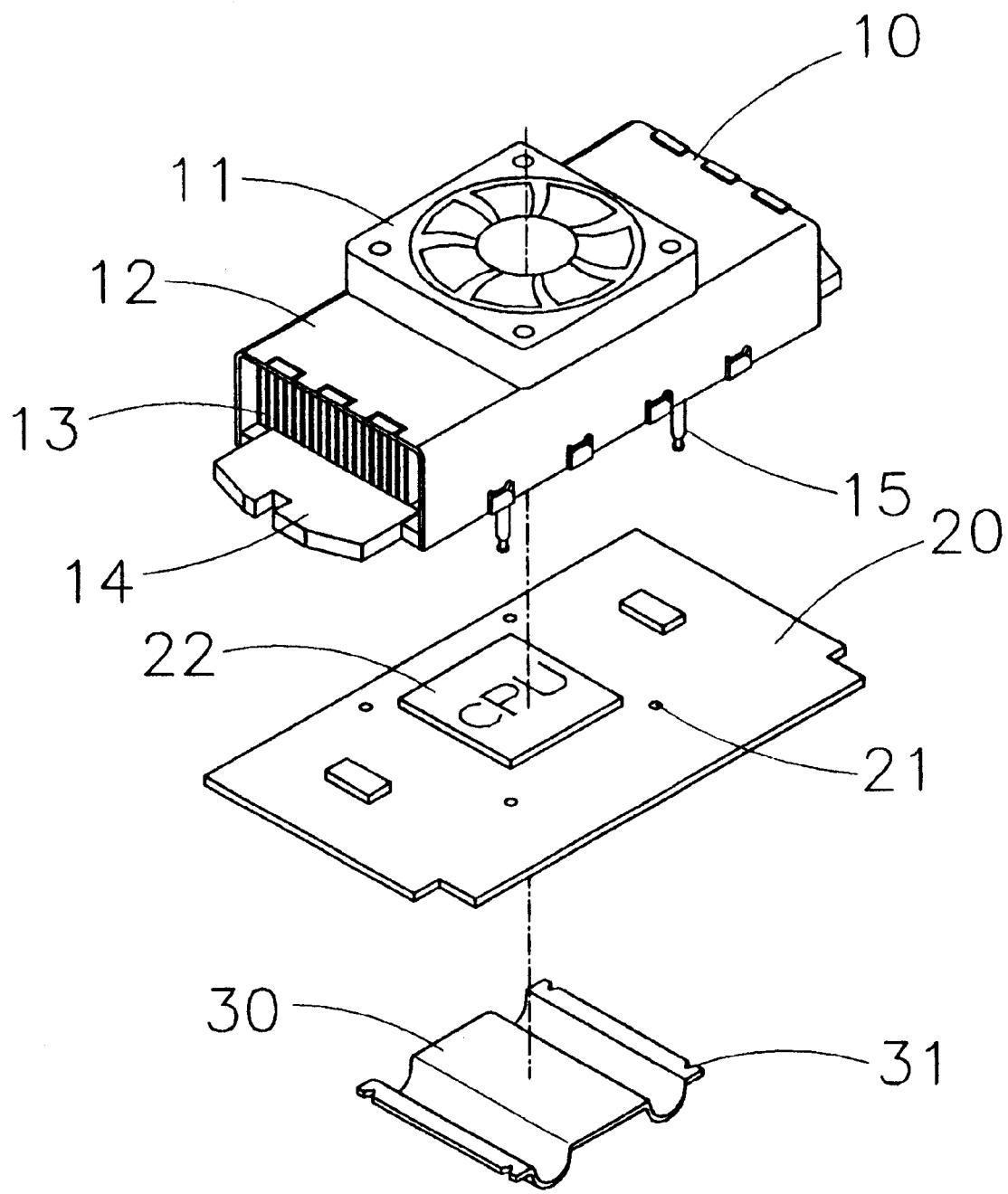
FIG. 1 is an exploded drawing of a conventional CPU and heat dissipation device.
Figure 2:
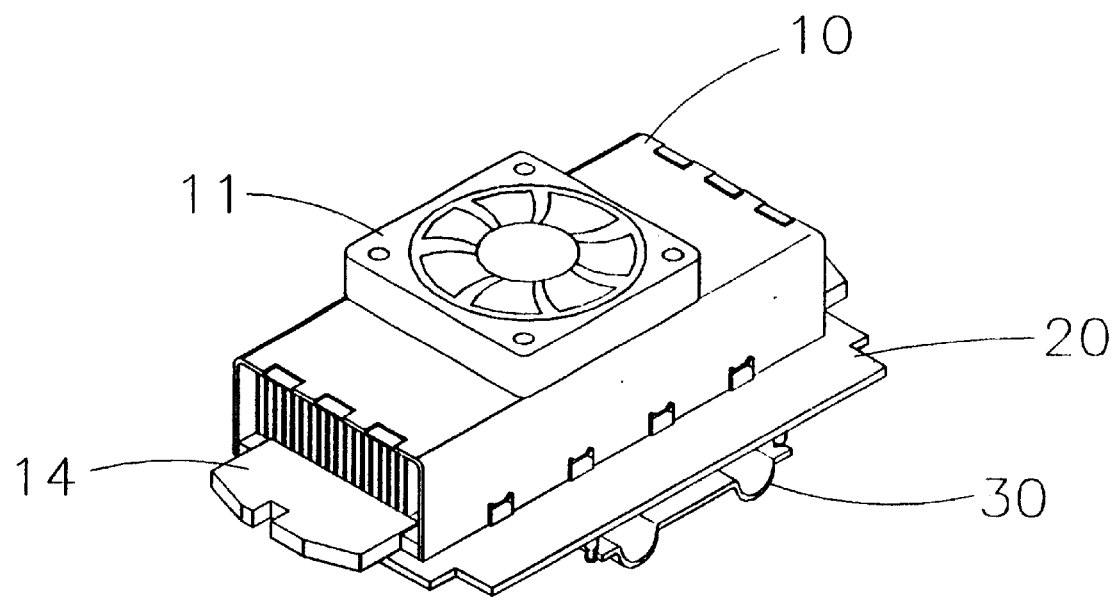
FIG. 2 is an isometric drawing of a conventional CPU and heat dissipation device.
Figure 3:
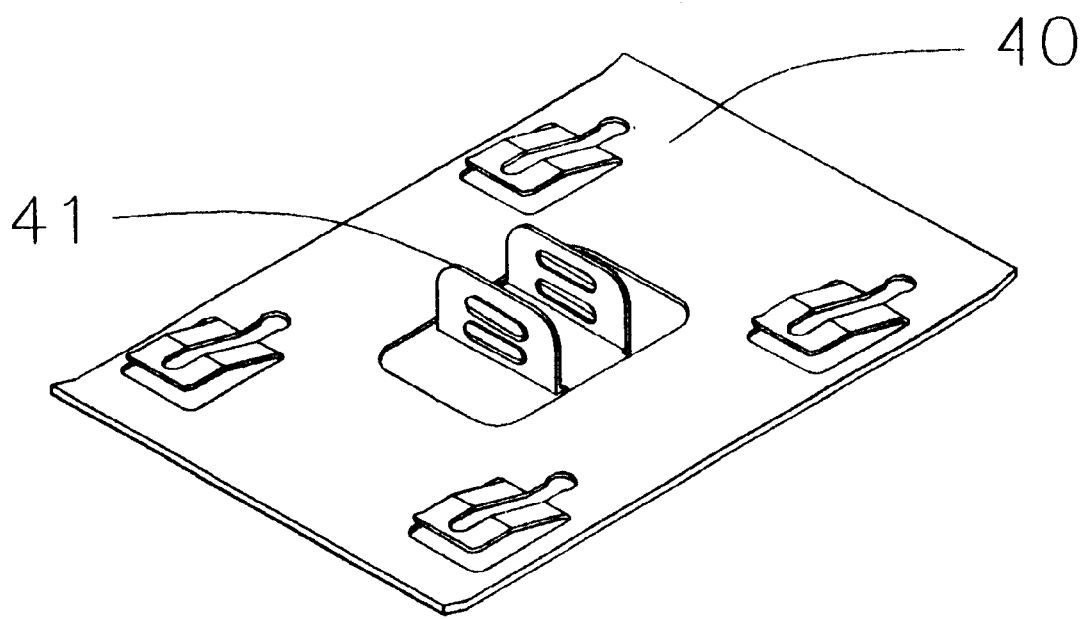
FIG. 3 is an isometric drawing of a conventional tensile fastening element.

Referring to FIG. 4, FIG. 5, and FIG. 6, the computer central processing unit (CPU) heat dissipation device latching structure of the invention herein is comprised of a curved rectangular tensile latch element 50, the frame plate 501 of which has a first fastening hole 51, a second fastening hole 52, a third fastening hole 53, and a fourth fastening hole 54 formed proximal to the four corners of the upper and lower ends, wherein the first fastening hole 51 consists of a circular first locating opening 511 and a narrowing rearward extending first slide positioning slot 512, with the first locating opening 511 facing the left; the second fastening hole 52 consists of a second slide positioning slot 522 and a second locating opening 521, with the second locating opening 521 facing the right; however, the second slide positioning slot 522 is lengthier than the first slide positioning slot 512, thereby leaving space for movement when the tensile latch element 50 is rotated; the third fastening hole 53 consists of a third slide positioning slot 532 and a third locating opening 531, with the third locating opening 531 situated in a section protruding upward from the frame plate 501 and, furthermore, facing the left at an angle of approximately 45 degrees, thereby enabling the tensile latch element 50 to be rotated into position; and the fourth fastening hole 54 consists of a fourth slide positioning slot 542 and a fourth locating opening 541, with the fourth locating opening 541 disposed vertically by design to enable the proper aligned positioning of the tensile latch element 50 during rotation.

Figure 7:
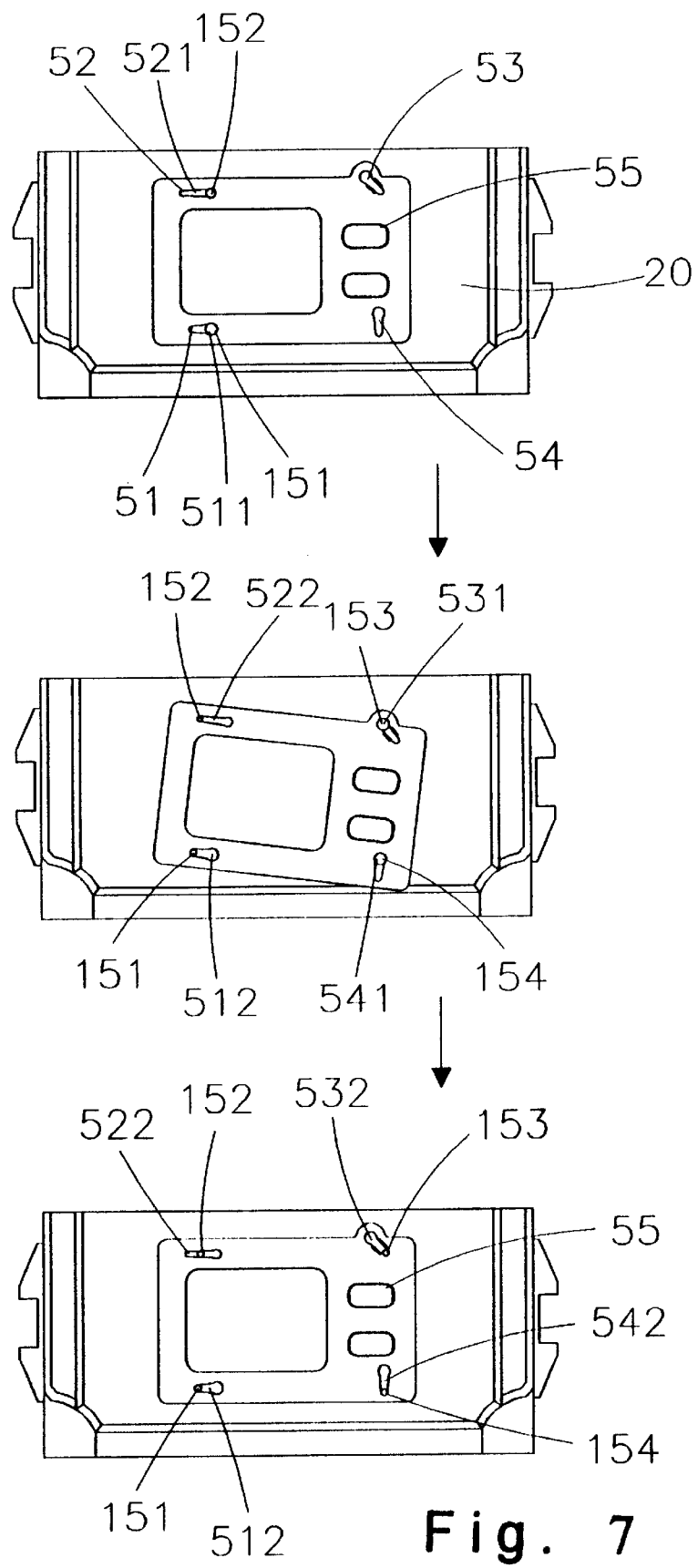
FIG. 7 are orthographic drawings of the invention here that illustrate the consecutive installation steps, as viewed from a top perspective.
Figure 8:
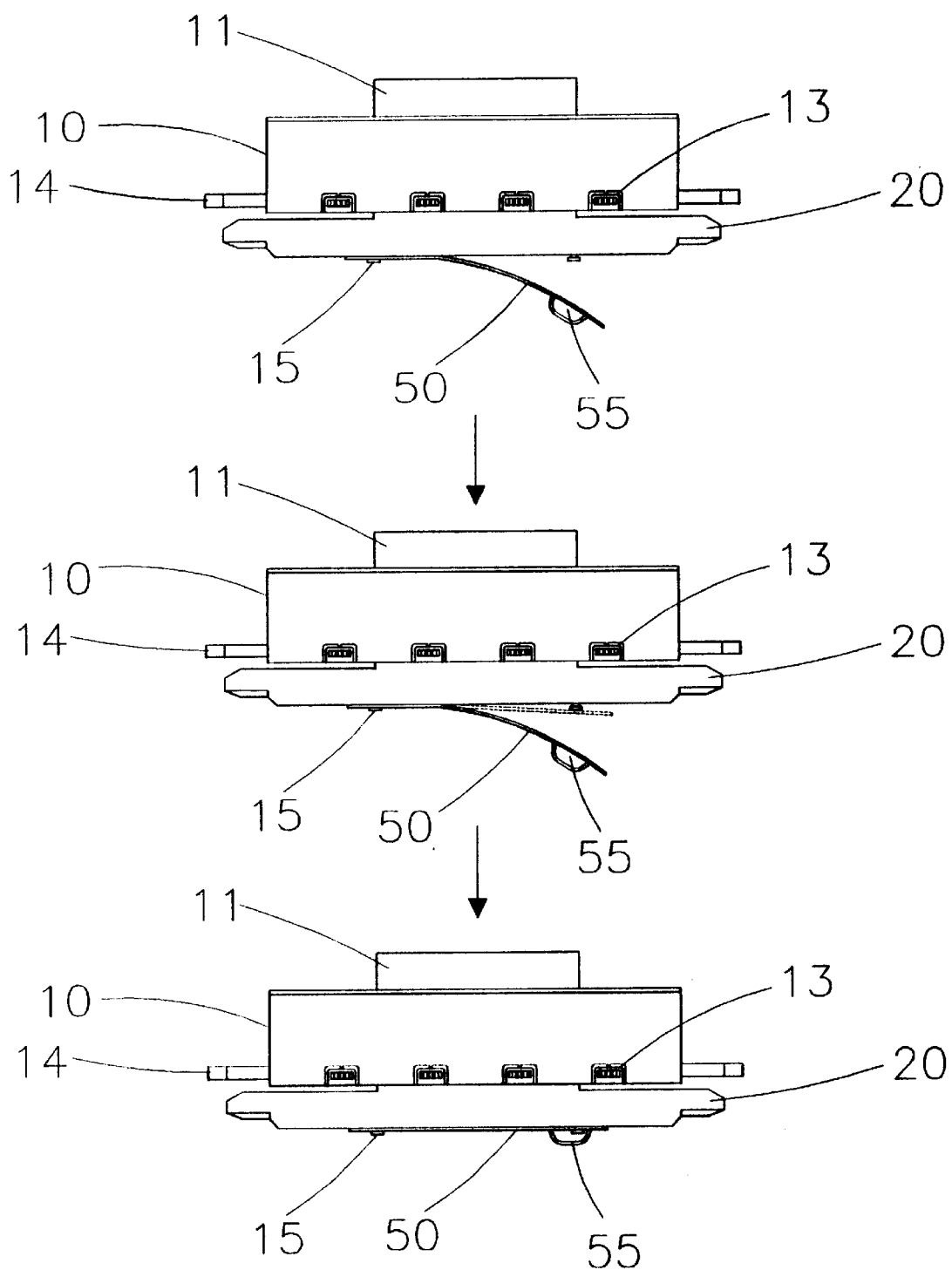
FIG. 8 are orthographic drawings of the invention here that illustrate the consecutive installation steps, as viewed from a lateral perspective.

Referring to FIG. 7 and FIG. 8, after the fan 11 is screw fastened to the heat sink 10, the mounting pins 15 are extended through the bottom plate 14 of the heat sink 10 and then inserted into the mounting holes 21 of the CPU board 20, thereby enabling the fixed placement of the bottom plate 14 of the heat sink 10 flush against the CPU 22; then, following assembly of the invention herein, the first mounting pin 151 is inserted into the first locating opening 511 and the second mounting pin 152 is inserted into the second locating opening 521 to complete the first step; next, taking the first fastening hole 51 as a center point, the tensile latch element 50 is rotated clockwise until postured at an angle, at which time the first mounting pin 151 is pushed into the first slide positioning slot 512 and the second mounting pin 152 is pushed into the second slide positioning slot 522, while the third locating opening 153 and the fourth locating opening 541 remain situated over the third mounting pin 153 and the fourth mounting pin 154, respectively, to complete the second step; the tensile latch element 50 is then pressed downward to enable the respective insertion of the third mounting pin 153 and the fourth mounting pin 154 into the third locating opening 153 and the fourth locating opening 541, following which it is rotated counter-clockwise to push the third mounting pin 153 into the third slide positioning slot 532 and the fourth mounting pin 154 into the fourth slide positioning slot 542 and, furthermore, following this proper aligned positioning, each of the four mounting pins 151, 152, 153, and 154 are held fast against the tensile latch element 50 by its outward tension, which thereby completes the tight union of the heat dissipation device to the computer CPU.

Another aspect worthy of mention is that a projecting wave-shaped press section 55 is situated in between the third fastening hole 53 and the fourth fastening hole 54 of the invention herein to increase frictional grip and facilitate rotation such that when the installer aligns and rotates the tensile latch element 50 during installation, the tensile latch element 50 is easily and stably turned around, with no injury to the installer.

The said drawings and component names have been adopted to facilitate the description of the invention herein and, furthermore, shall not be construed as a limitation on the patent claims of the present invention and all adaptations or modifications based on the innovative scope and structural components of the invention herein shall remain within the protected scope and claims of the invention herein.

In summation of the foregoing section, since the computer central processing unit (CPU) heat dissipation device latching structure of the invention herein is a reasonably perfected invention that not only possesses excellent practicality, but also has a unique and unprecedented structural and spatial configuration design, original features and, furthermore, is installed into position by rotation to support easy and rapid fastening to thereby increase production speed, while being highly superior to the conventional technology and, furthermore, is not the simple extension of an existent idea, but a progressive innovation, therefore, the invention herein fully complies with all new patent application requirements and is hereby submitted to the patent bureau for review and granting of the commensurate patent rights.

What is claimed is:

1. A computer central processing unit (CPU) heat dissipation device latching structure comprised of a tensile latch element having four fastening holes, with each of the said fastening holes formed proximal to the four corners of a frame plate and which are utilized for alignment with and coupling to four mounting pins; each of the said fastening holes consists of a circular locating opening and a narrowing rearward extending slide positioning, wherein the innovative features are: the first fastening hole and the second fastening hole both extend horizontally to the right, however, the second slide positioning slot is lengthier than the first slide positioning slot; the third locating opening is situated in a section protruding upward from the said frame plate such that the third fastening hole faces the left at an angle of approximately 45 degrees, thereby enabling the said tensile latch element to be rotated into position; and the fourth fastening hole is disposed vertically from top to bottom.

2. As mentioned in claim 1 of the computer central processing unit (CPU) heat dissipation device latching structure of the invention herein, a wave-shaped press section is situated in between the said third fastening hole and the said fourth fastening hole to facilitate the easy, stable rotation of the said tensile latch element.

* * * * *